United States Patent
Shin et al.

(10) Patent No.: US 11,423,826 B2
(45) Date of Patent: Aug. 23, 2022

(54) DISPLAY APPARATUS AND MANUFACTURING METHOD FOR THE SAME

(71) Applicant: SAMSUNG ELECTRONICS CO., LTD., Suwon-si (KR)

(72) Inventors: Sang Min Shin, Suwon-si (KR); Ho Seop Lee, Seoul (KR); Sang Young Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 96 days.

(21) Appl. No.: 16/159,077

(22) Filed: Oct. 12, 2018

(65) Prior Publication Data
US 2019/0114958 A1    Apr. 18, 2019

(30) Foreign Application Priority Data

Oct. 13, 2017  (KR) .......................... 10-2017-0133229

(51) Int. Cl.
G09G 3/32       (2016.01)
H01L 27/12      (2006.01)
H01L 27/15      (2006.01)

(52) U.S. Cl.
CPC ........... *G09G 3/32* (2013.01); *H01L 27/1214* (2013.01); *H01L 27/156* (2013.01); *G02F 2201/121* (2013.01); *G02F 2201/123* (2013.01); *G09G 2300/0452* (2013.01); *G09G 2300/0842* (2013.01); *G09G 2310/0264* (2013.01)

(58) Field of Classification Search
USPC ........................................................ 345/30
See application file for complete search history.

(56) References Cited

U.S. PATENT DOCUMENTS

| | | | |
|---|---|---|---|
| 9,252,375 B2 | 2/2016 | Bibl et al. | |
| 9,520,537 B2 | 12/2016 | Bower et al. | |
| 2008/0246043 A1 | 10/2008 | Tajima et al. | |
| 2011/0241040 A1 | 10/2011 | Yu et al. | |
| 2012/0169222 A1* | 7/2012 | Liu | H01J 31/127 |
| | | | 313/506 |
| 2014/0267683 A1* | 9/2014 | Bibl | G09G 3/006 |
| | | | 348/87 |

(Continued)

FOREIGN PATENT DOCUMENTS

| | | | |
|---|---|---|---|
| CN | 206098444 U | 4/2017 | |
| KR | 20150119149 | * 10/2015 | ............. H01L 21/77 |

(Continued)

OTHER PUBLICATIONS

Machine translation of CN206098444; Wei; Apr. 2017.*

(Continued)

*Primary Examiner* — Ifedayo B Iluyomade
(74) *Attorney, Agent, or Firm* — Sughrue Mion, PLLC

(57) ABSTRACT

A display apparatus and a manufacturing method thereof including a plurality of light emitting diode (LED) elements, signal electrodes configured to supply data signals to the plurality of LED elements, and a common electrode configured to provide a ground to the plurality of LED elements, in which one end of each of the plurality signal electrodes is surrounded by the common electrode or respective ends of the common electrode are surrounded by the plurality of signal electrodes.

17 Claims, 13 Drawing Sheets

(56) References Cited

U.S. PATENT DOCUMENTS

| | | |
|---|---|---|
| 2016/0189593 A1 | 6/2016 | Lee et al. |
| 2017/0141155 A1 | 5/2017 | Hughes et al. |
| 2017/0250168 A1 | 8/2017 | Do et al. |

FOREIGN PATENT DOCUMENTS

| | | | |
|---|---|---|---|
| KR | 20150119149 A | | 10/2015 |
| KR | 10-2017-0031969 A | | 3/2017 |
| KR | 20170031969 | * | 3/2017 |
| KR | 10-2017-0049117 A | | 5/2017 |
| KR | 10-2017-0057818 A | | 5/2017 |
| WO | 2014/149864 A1 | | 9/2014 |

OTHER PUBLICATIONS

Communication dated Feb. 14, 2019, issued by the International Searching Authority in International Application No. PCT/KR2018/011997 (PCT/ISA/210).

Search Report dated Jun. 17, 2020 by the European Patent Office in counterpart European Patent Application No. 18866962.6, including Annex Documents (EPO Machine Translations of KR20170049117A (previously submitted in IDS of May 14, 2019), KR20170057818A (same), KR20170031969A (same), CN206098444U (submitted herewith)).

Communication dated May 28, 2022, issued by the Korean Intellectual Property Office in Korean Patent Application No. 9-5-2022-039537175.

* cited by examiner

DISPLAY APPARATUS AND MANUFACTURING METHOD FOR THE SAME

CROSS-REFERENCE TO RELATED APPLICATION(S)

This application is based on and claims priority under 35 U.S.C. § 119 to Korean Patent Application No. 10-2017-0133229, filed on Oct. 13, 2017, in the Korean Intellectual Property Office, the disclosure of which is incorporated by reference herein in its entirety.

BACKGROUND

1. Field

Embodiments of the present disclosure relate to a display apparatus displaying an image by using a light emitting diode and a manufacturing method thereof.

2. Description of Related Art

A display apparatus is an output device that converts electrical information into visual information and displays information to a user. The display apparatus may be implemented as a television or a monitor, or a portable device such as a notebook personal computer (PC), a smart phone, and a tablet PC.

The display apparatus may include a light receiving display panel such as a liquid crystal display (LCD), and a self-luminous display panel that generates light corresponding to a data signal.

Particularly, a light emitting diode (LED) has been actively studied for implementing a self-luminous display panel. A light emitting diode is a device for converting an electrical signal into a form of light such as infrared rays and visible light, by using the characteristics of compound semiconductors. LEDs may be used for home appliances, remote controls, electronic boards, and a variety of other devices. In addition, the LED has been widely used for small hand-held electronic devices and large-size display apparatuses.

SUMMARY

Therefore, an aspect of the present disclosure provides an improved display apparatus capable of providing a signal electrode supplying a data signal and a ground, and a manufacturing method thereof.

Additional aspects of the present disclosure will be set forth in part in the description which follows and, in part, will be apparent from the description, or may be learned by practice of techniques described in the present disclosure.

In accordance with an aspect of the disclosure, there is provided a display apparatus including a plurality of light emitting diode (LED) elements, a plurality of signal electrodes configured to supply data signals to the plurality of LED elements, respectively, and a common electrode configured to provide a ground to the plurality of LED elements, wherein one end of each of the plurality signal electrodes is surrounded by the common electrode or respective ends of the common electrode are surrounded by the plurality of signal electrodes.

The plurality of LED elements, the signal electrodes, and the common electrode may be contained in a single pixel region configured to select a single color.

If the one end of each of the plurality signal electrodes is surrounded by the common electrode, a width of the one end of each of the plurality signal electrodes is greater than a width of distal ends of the plurality of signal electrodes, and if the respective ends of the common electrode are surrounded by the plurality of signal electrodes, a width of the respective ends of the common electrode is greater than a width of a distal end of the common electrode.

The display apparatus may further include a substrate having a plurality of scan lines and a plurality of data line provided on one side thereof. The plurality of LED elements, the signal electrodes, and the common electrode may be contained in a pixel region configured to output a color. The pixel region may include a plurality of sub-pixel regions formed on intersections between the scan lines and the data lines.

The plurality of LED elements may be bonded on the signal electrodes and the common electrode.

The pixel region may be composed of three sub-pixel regions adjacent to each other.

A replaceable region of each of the plurality of LED elements may be provided in the sub-pixel regions.

The signal electrode may include an end portion connected to an LED element among the plurality of LED elements provided on one end of the signal electrode and a connecting portion extended from the end portion.

The end portion may be provided in an annular shape.

If respective ends of the common electrode are surrounded by the plurality of signal electrodes, the common electrode may include a plurality of end portions diverged from a distal end of the common electrode, and a plurality of connecting portions extended from the plurality of end portions.

The plurality of end portions may be provided in an annular shape.

A width of each of the plurality of end portions may be greater than a width of the connecting portions.

In accordance with an aspect of the disclosure, there is provided a display apparatus including a plurality of light emitting diode (LED) elements, a plurality of signal electrodes configured to supply a data signal to the plurality of LED elements; and a common electrode configured to provide a ground to the plurality of LED elements. Any one of the signal electrodes and the common electrode is provided in an annular shape.

The annular shape may include an open annular shape or a closed annular shape.

The plurality of LED elements, the signal electrodes, and the common electrode may be contained in a pixel region configured to output a color. One end of the any one electrode may have a width greater than a width of the other end of the any one electrode.

The display apparatus may further include a substrate having a plurality of scan lines and a plurality of data line provided on one side thereof. The plurality of LED elements, the signal electrodes, and the common electrode may be contained in a pixel region configured to output a color. The pixel region may include a plurality of sub-pixel regions formed on intersections between the scan lines and the data lines.

The pixel region may be composed of three sub-pixel regions adjacent to each other.

In accordance with an aspect of the disclosure, A display apparatus include a pixel region, the pixel region comprising: a first sub-pixel region comprising a red light emitting diode (LED) emitting red light; a second sub-pixel region comprising a green LED emitting green light; a third sub-pixel region comprising a blue LED emitting blue light; and a common electrode connected to a cathode of the red LED, a cathode of the green LED, and a cathode of the blue LED.

The pixel region may further include: a first signal electrode connected to an anode of the red LED; a second signal electrode connected to an anode of the green LED; and a third signal electrode connected to an anode of the blue LED.

The common electrode may surround an end of the first signal electrode to which the anode of the red LED is connected, an end of the second signal electrode to which the anode of the green LED is connected, and an end of the third signal electrode to which the anode of the blue LED is connected.

The common electrode substantially may surround an end of the first signal electrode to which the anode of the red LED is connected, an end of the second signal electrode to which the anode of the green LED is connected, and an end of the third signal electrode to which the anode of the blue LED is connected.

The common electrode may substantially surround three sides of the end of the first signal electrode to which the anode of the red LED is connected, three sides of the end of the second signal electrode to which the anode of the green LED is connected, and three sides of the end of the third signal electrode to which the anode of the blue LED is connected.

The first signal electrode may include a first connecting portion connected to and extending from a side of the end of the first signal electrode to which the anode of the red LED is connected, a width of the first connecting portion being less than a width of the end of the first signal electrode to which the anode of the red LED is connected, wherein the second signal electrode comprises a second connecting portion connected to and extending from a side of the end of the second signal electrode to which the anode of the green LED is connected, a width of the second connecting portion being less than a width of the end of the second signal electrode to which the anode of the green LED is connected, and wherein the third signal electrode comprises a third connecting portion connected to and extending from a side of the end of the third signal electrode to which the anode of the blue LED is connected, a width of the third connecting portion being less than a width of the end of the third signal electrode to which the anode of the blue LED is connected.

The pixel region may further include at least one of: a replacement red LED, an anode of the replacement red LED connected to the first signal electrode and a cathode of the replacement red LED connected to the common electrode; a replacement green LED, an anode of the replacement green LED connected to the second signal electrode and a cathode of the replacement green LED connected to the common electrode; and a replacement blue LED, an anode of the replacement blue LED connected to the third signal electrode and a cathode of the replacement blue LED connected to the common electrode.

The replacement red LED comprises a plurality of replacement red LEDs, the replacement green LED comprises a plurality of replacement green LEDs, and the replacement blue LED comprises a plurality of replacement blue LEDs.

In accordance with an aspect of the disclosure, there is provided a method of a manufacturing of display apparatus, the method including providing a plurality of signal electrodes configured to supply data signals to a plurality of light emitting diode (LED) elements and providing a common electrode configured to provide a ground to the plurality of light emitting diode (LED) elements, and providing the plurality of light emitting diode (LED) elements, wherein one end of each of the plurality signal electrodes is surrounded by the common electrode or respective ends of the common electrode are surrounded by the plurality of signal electrodes.

BRIEF DESCRIPTION OF THE DRAWINGS

The above and other aspects of the disclosure will become apparent and more readily appreciated from the following description of embodiments, taken in conjunction with the accompanying drawings of which.

DETAILED DESCRIPTION

Figure 1:
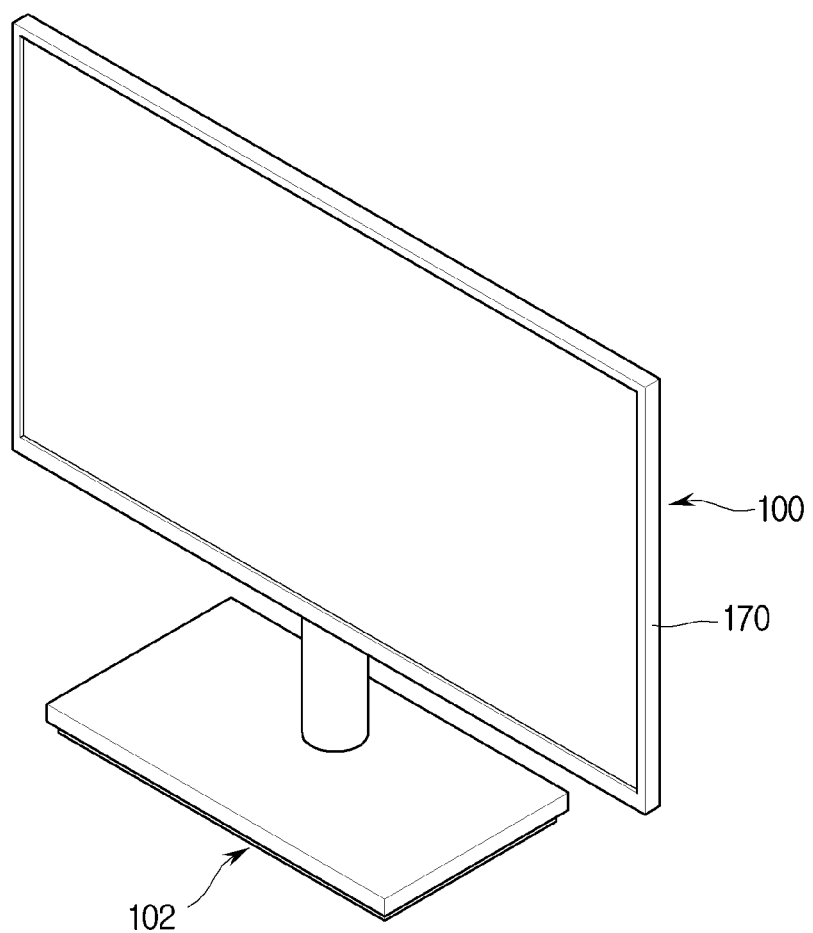
FIG. 1 is a view illustrating an exterior of a display apparatus according to an embodiment.

Embodiments described in the present disclosure and configurations shown in the drawings are merely examples, which may be modified in various different ways as would have been understood by the artisan of ordinary skill to which the present disclosure relates.

The terms used herein are used to describe the embodiments and are not intended to limit and/or restrict the present disclosure.

The singular forms "a," "an" and "the" are intended to include the plural forms as well, unless the context clearly indicates otherwise.

In this present disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

It will be understood that, although the terms first, second, third, etc., may be used herein to describe various elements, but elements are not limited by these terms.

Expressions such as "at least one of," when preceding a list of elements, modify the entire list of elements and do not modify the individual elements of the list. For example, the expressions "at least one of a, b, and c" and "at least one of a, b, and/or c" should be understood as including only a, only b, only c, both a and b, both a and c, both b and c, or all of a, b, and c.

In addition, terms such as "unit", "part", "block", "member", and "module" indicate a unit for processing at least one function or operation, wherein the terms may represent at least one hardware such as Field Programmable Gate Array (FPGA), Application Specific Integrated Circuit (ASIC), at least one software stored in a memory, or at least one process processed by a processor.

The present disclosure will be described more fully hereinafter with reference to the accompanying drawings. Like reference numerals refer to like elements throughout the description. Well-known functions or constructions are not described in detail because they would obscure the one or more exemplar embodiments with unnecessary detail.

Hereinafter a display apparatus represents any apparatus capable of providing an image to a user by displaying the image. For example, the display apparatus may include a television, a monitor, a laptop computer, and a display device of a mobile communication terminal.

Figure 2:
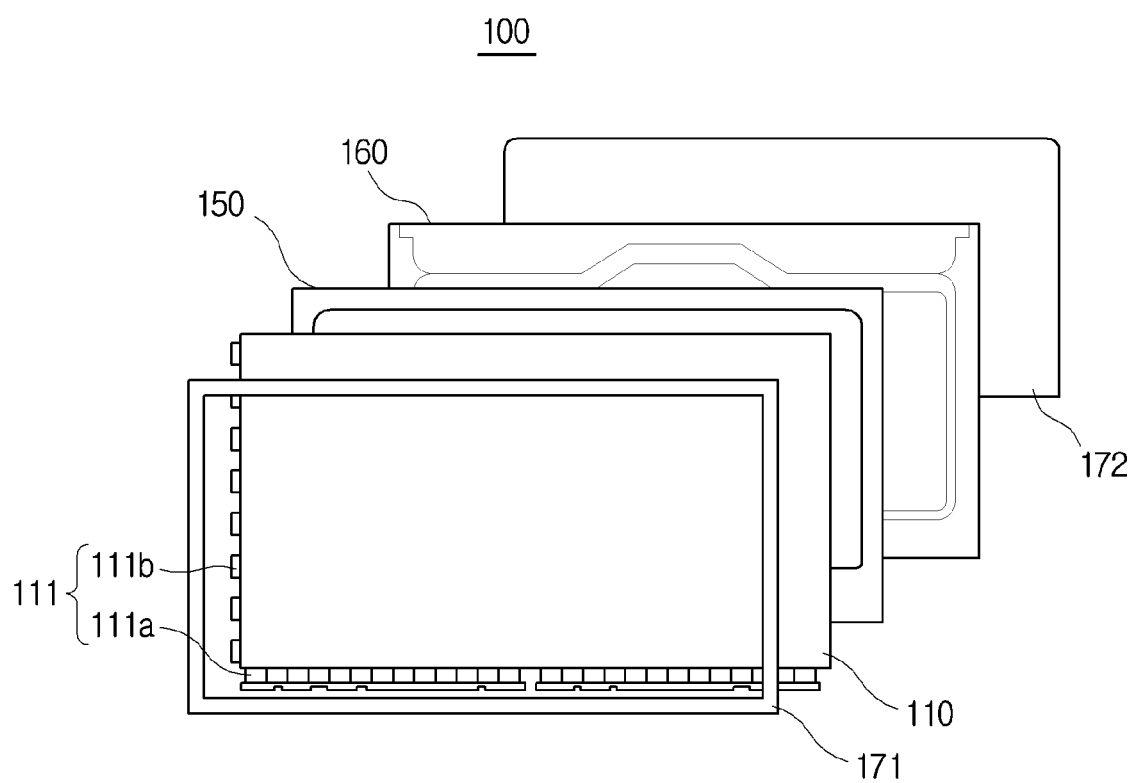
FIG. 2 is an exploded perspective view illustrating the display apparatus according to an embodiment.
Figure 3:
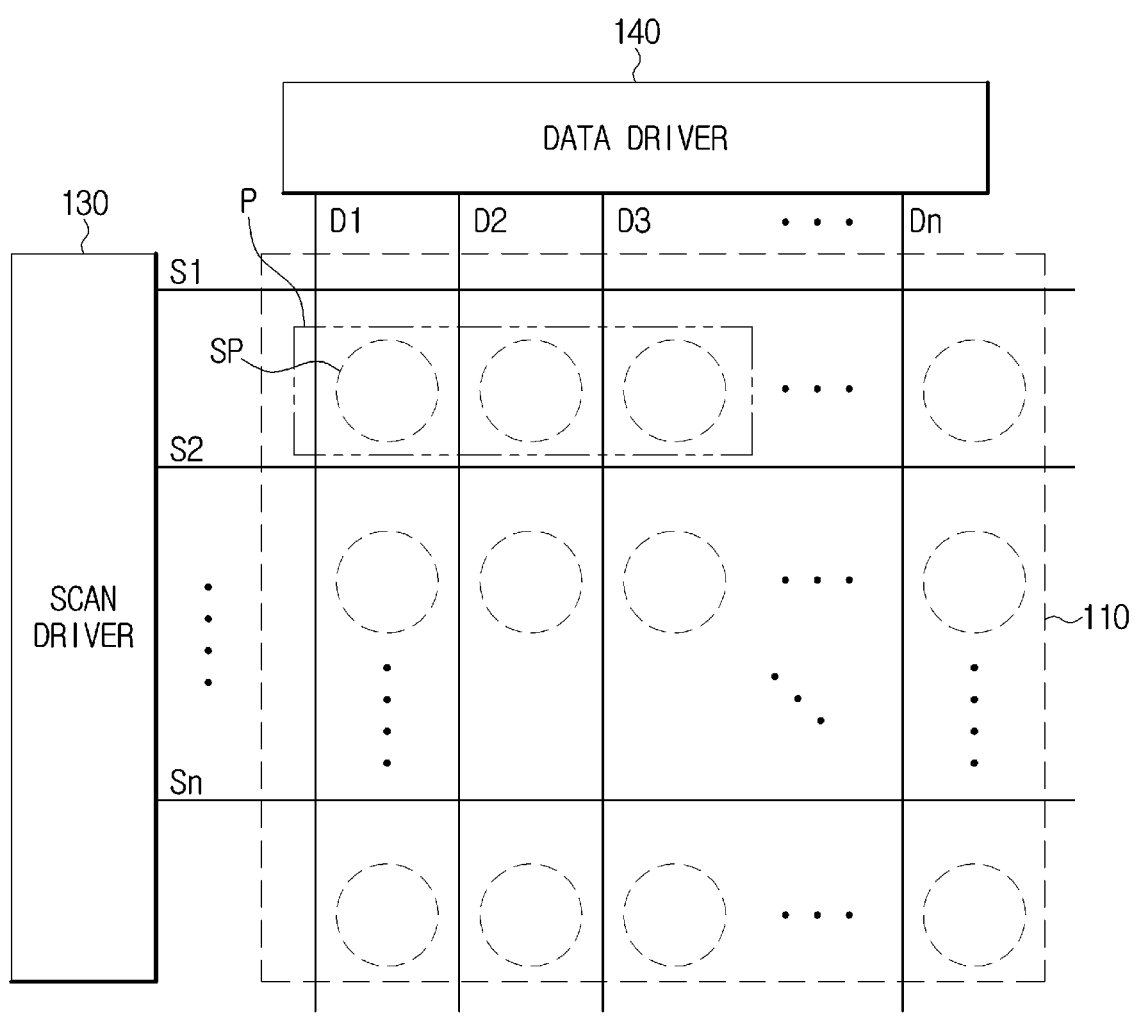
FIG. 3 is a view schematically illustrating a configuration of a display panel according to an embodiment.
Figure 4:
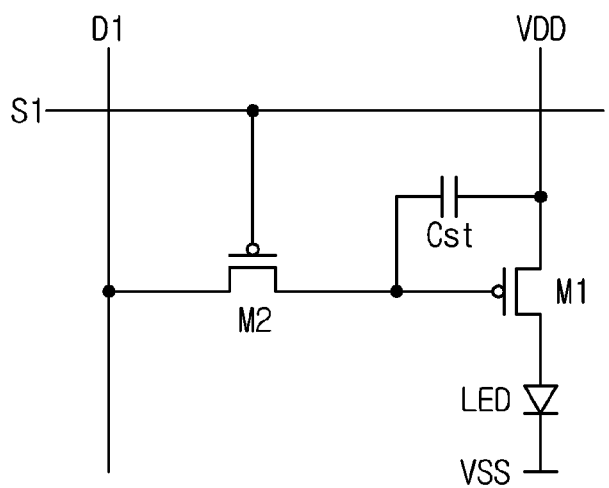
FIG. 4 is a circuit diagram illustrating a sub-pixel circuit provided in a sub-pixel region of the display panel of FIG. 3.
Figure 5:
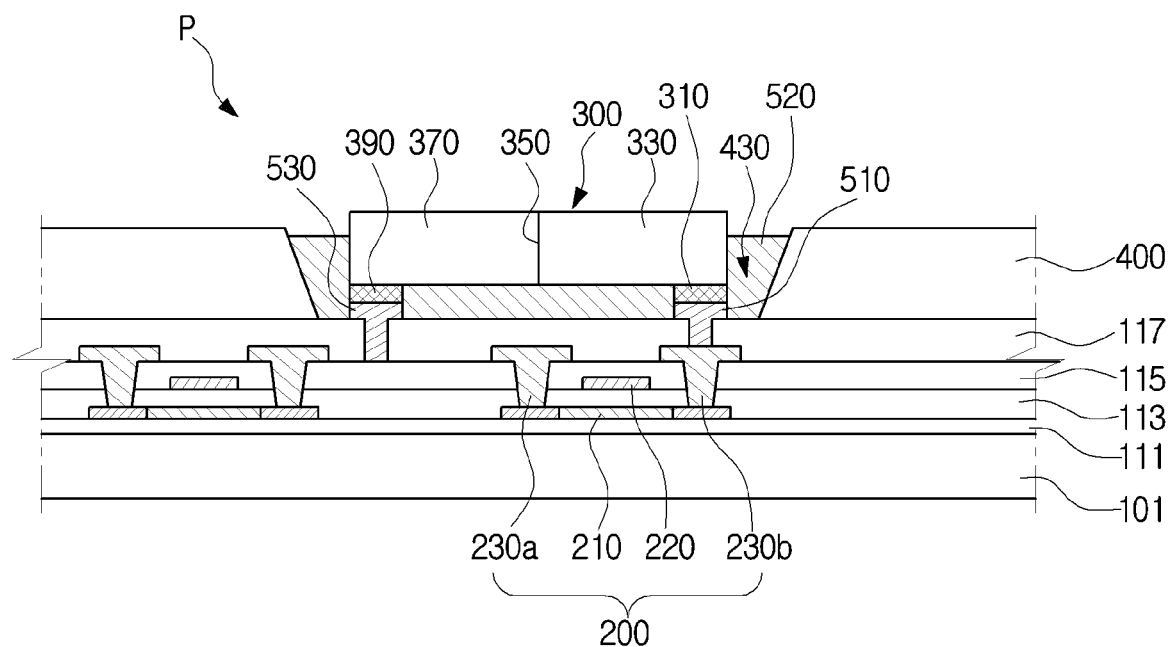
FIG. 5 is a plan view illustrating a layout structure of the sub-pixel region of the display panel of FIG. 3.

FIG. 1 is a view illustrating an exterior of a display apparatus according to an embodiment. FIG. 2 is an exploded perspective view illustrating the display apparatus according to an embodiment. FIG. 3 is a view schematically illustrating a configuration of a display panel according to an embodiment. FIG. 4 is a circuit diagram illustrating a sub-pixel circuit provided in a sub-pixel region of the display panel of FIG. 3. Last, FIG. 5 is a plan view illustrating a layout structure of the sub-pixel region of the display panel of FIG. 3.

A display apparatus 100 may receive an electric signal from a source, and display an image corresponding to the electric signal on a screen of the display apparatus 100. Particularly, the display apparatus 100 may control color of each of a plurality of pixels within a predetermined display region, to allow a user to recognize the display region as an image or a sequence of images.

In FIG. 1, an example in which the display apparatus 100 is supported by a stand 102 mounted to a lower end of the display apparatus 100 is illustrated. Alternatively, the display apparatus 100 may be installed on a wall by a bracket.

Referring to FIG. 2, the display apparatus 100 may include a display panel 110, a support member 150, a chassis 160, and a housing 170.

The housing 170 may form an external appearance of the display apparatus 100 and may include a bezel 171 and a cover 172. The bezel 171 and the cover 172 may be coupled with each other to form an accommodating space in which other components of the display apparatus 100 may be disposed. The display panel 110, the support member 150, and the chassis 160 may be disposed in the accommodating space.

The support member 150 may support the display panel 110 and the chassis 160 disposed between the bezel 171 and the cover 172. For this, the support member 150 may be detachably coupled to the bezel 171 to fix the display panel 110 and the chassis 160.

The chassis 160 may include a panel connecting a variety of components required for image display and sound output. A variety of printed circuit board and input and output devices may be provided on the chassis 160. Therefore, the chassis 160 may be formed of a metal having excellent heat dissipation and excellent strength.

The display panel 110 may represent a panel emitting light having a frequency corresponding to an image signal, which is transmitted from an external source (and received by the display apparatus 100) or generated in the display apparatus 100, to allow a user to visually recognize an image.

For this, the display panel 110 may include a substrate and a plurality of light emitting diode (LED) elements 300. An electrode pattern 111, which is generated by a scan line 111b and a data line 111a, which cross each other in a perpendicular manner of rows and columns, is provided on the substrate. The plurality of light emitting diode (LED) elements 300 is bonded to the electrode pattern 111 of the substrate.

Referring to FIG. 3, a data line D1-Dm, a scan line S1-Sn and a sub-pixel circuit in a plurality of sub-pixel region SP may be provided as the electrode pattern on one surface of the display panel 110. Sub-pixel region SP may represent a region that is adjacent to an intersection between the data line D1-Dm and the scan line S1-Sn, and that is provided with the sub-pixel circuit. The plurality of sub pixel regions SP may be grouped into pixel regions, and one color represented by the corresponding pixels may selected by mixing the respective lights of the plurality of sub pixel regions SP generated in one pixel region P.

The data lines D1 to Dm may transmit a data signal representing an image signal to the sub pixel circuits in the sub pixel region SP, and the scan lines S1 to Sn may transmit a scan signal to the sub pixel circuits in the sub pixel region SP.

By a scan driver 130, the scan signal may be sequentially applied to each of the plurality of scan lines S1-Sn arranged in the row direction, and by a data driver 140, the data signal (VDATA) corresponding to the image signal may be applied to the plurality of data lines D1-Dm arranged in the column direction.

The scan driver 130 and/or the data driver 140 may be electrically connected to the display panel 110, or may be mounted to a tape carrier package (TCP), which is bonded to the display panel 110 and then electrically connected to the display panel 110, as the form of a chip. Alternatively, the scan driver 130 and/or the data driver 140 may be mounted to a Flexible Printed Circuit (FPC) or film, which is bonded to the display panel 110 and then electrically connected to the display panel 110, as the form of a chip. In addition, the scan driver 130 and/or the data driver 140 may be directly mounted to the substrate of the display panel.

FIG. 4 is an equivalent circuit diagram of the sub-pixel circuit in the sub pixel region SP of FIG. 3. Particularly, FIG. 4 illustrates a sub-pixel circuit driven by a first scan line S1 and a first data line D1.

Referring to FIG. 4, the sub-pixel circuit may include a light emitting diode (LED) element, two transistors M1 and M2, and a capacitor Cst. The plurality of transistors M1 and M2 may be provided by PMOS transistors. However, such a circuit configuration is merely an example of the sub-pixel circuit, and is not limited to the circuit configuration of FIG. 4.

As for a switching transistor M2, a gate electrode may be connected to the scan line Sn, a source electrode may be connected to the data line Dm, a drain electrode may be connected to one end of the capacitor Cst and a gate electrode of a driver transistor M1, and the other end of the capacitor Cst may be connected to a power voltage VDD. As for the driver transistor M1, a source electrode may be connected to the power voltage VDD, and a drain electrode may be connected to an anode 310 of the LED element. A cathode 390 of the LED element may be connected to a reference voltage VSS and thus the LED element may emit light based on the current applied from the driver transistor M1. The reference voltage VSS connected to the cathode 390 of the LED element may be lower than the power voltage VDD and thus a ground voltage may be used as the reference voltage VSS.

An operation of the sub-pixel circuit is as follows. First, when the scan signal is applied to the scan line Sn and the switching transistor M2 is turned on, the data voltage may be transmitted to one end of the capacitor Cst and the gate electrode of the driver transistor M1. As a result, a gate-source voltage VGS of the driver transistor M1 may be maintained for a predetermined period of time, by the capacitor Cst. In addition, the driver transistor M1 may allow the LED element to emit light by applying a current corresponding to the gate-source voltage VGS of the driver transistor M1 to the anode 310 of the LED element.

When a high data voltage is transmitted to the gate electrode of the driver transistor M1, the gate-source voltage VGS of the driver transistor M1 may be lowered. Accordingly, a small amount of current may be applied to the anode 310 of the LED element and thus the LED element may less emit light. Therefore, the LED element may display a low gradation. On the other hand, when a low data voltage is transmitted to the gate electrode of the driver transistor M1, the gate-source voltage VGS of the driver transistor M1 may be increased. Accordingly, a large amount of current may be applied to the anode 310 of the LED element and thus the LED element may emit more light. Therefore, the LED element may display a high gradation. Thus, a level of data voltage applied to each sub pixel circuits may be selected based on an image to be displayed.

FIG. 5 illustrates an example of a cross-section of the sub pixel region SP. FIG. 5 illustrates a case in which two transistors 200 are provided, particularly, one of two transistors 200 is connected to the LED element 300.

The substrate 101 may include various materials. For example, the substrate 101 may be formed of a transparent glass material containing SiO2 as a main component, but the substrate 101 is not limited thereto. Therefore, the substrate 101 may be formed of transparent plastic material and thus the substrate 101 may have flexibility. The plastic material may be an insulating organic material selected from a group consisting of polyethersulphone (PES), polyacrylate (PAR), polyetherimide (PEI), polyethyelenenaphthalate (PEN), polyethylene terephthalate (PET), polyphenylene sulfide (PPS), polyallylate, polyimide, polycarbonate (PC), cellulose triacetate (TAC), and cellulose acetate propionate (CAP).

When the substrate 101 is a bottom emission type that an image to be displayed is implemented to a direction of the substrate 101, the substrate 101 may be formed of a transparent material. On the other hand, when the substrate 101 is a top emission type that an image to be displayed is implemented to a direction opposite to the substrate 101, the substrate 101 may not necessarily be formed of a transparent material. In this case, the substrate 101 may be formed of metal.

When the substrate 101 is formed of metal, the substrate 101 may include at least one selected from a group consisting of iron, chromium, manganese, nickel, titanium, molybdenum, stainless steel (SUS), Invar alloy, Inconel alloy and kovar alloy, but is not limited thereto.

A buffer layer 111 may be formed on the substrate 101. The buffer layer 111 may provide a flat surface on the top of the substrate 101 and may prevent foreign materials or moisture from penetrating through the substrate 101. For example, the buffer layer 111 may be formed of an inorganic material such as silicon oxide, silicon nitride, silicon oxynitride, aluminum oxide, aluminum nitride, titanium oxide or titanium nitride, or an organic material such as polyimide, polyester, or acrylic. Alternatively, the buffer layer 111 may be formed by a plurality of stacked layers of the above-mentioned materials.

The transistor 200 and the LED element 300 may be provided on the buffer layer 111.

The transistor 200 may include an active layer 210, a gate electrode 220, a source electrode 230a and a drain electrode 230b. The active layer 210 may include a semiconductor material, and the active layer 210 may have a source region, a drain region, and a channel region between the source region and the drain region. The gate electrode 220 may be formed on the active layer 210 corresponding to the channel region. The source electrode 230a and the drain electrode 230b may be electrically connected to the source region and the drain region of the active layer 210, respectively. A first insulating layer 113 formed of an inorganic insulating material may be disposed as a gate insulating layer between the active layer 210 and the gate electrode 220. A second insulating layer 115 may be disposed as an interlayer insulating film between the gate electrode 220 and the source electrode 230a/the drain electrode 230b. A third insulating layer 117 may be disposed as a planarization film on the source electrode 230a/the drain electrode 230b. The second insulating layer 115 and the third insulating layer 117 may be formed of an organic insulating material or an inorganic insulating material. Alternatively, the second insulating layer 115 and the third insulating layer 117 may be formed by alternating the organic insulating material and the inorganic insulating material.

FIG. 5 illustrates that the transistor 200 is implemented in a top gate type in which a gate electrode is disposed on top of the active layer, but is not limited thereto. Therefore, the gate electrode may be disposed below the active layer.

A bank 400 defining the sub-pixel region SP may be disposed on the third insulating layer 117. The bank 400 may include a concave portion 430 in which the LED element 300 is to be accommodated. A height of the bank 400 may be selected based on a height of the LED element 300 and a viewing angle. A size (width) of the concave portion 430 may be selected based on resolution, and pixel density of the display apparatus 100. According to an embodiment, the height of the LED element 300 may be greater than the height of the bank 400. FIG. 5 illustrates that the concave portion 430 is in a polygonal shape, but the shape is not limited thereto. Therefore, the concave portion 430 may have various shapes such as a square shape, a polygonal shape, a rectangular shape, a circular shape, a conical shape, an elliptical shape and a triangle shape.

A signal electrode 510 may be disposed along a side surface and a bottom surface of the concave portion 430 and an upper surface of the bank 400 around the concave portion 430. The signal electrode 510 may be electrically connected to the source electrode 230a or the drain electrode 230b of the transistor 200 through a via hole formed on the third insulating layer 117. FIG. 5 illustrates that the signal electrode 510 is electrically connected to the drain electrode 230b.

The bank 400 may block light emitted to the side surface of the LED element 300 by acting as a light blocking portion having a low light transmittance. Therefore, the bank 400 may prevent light emitted from the LED elements 300 adjacent to each other from being mixed, and hence the color of light emitted from the LED elements 300 adjacent to each other may be prevented from being mixed. In addition, the bank 400 may improve the bright room contrast of the display apparatus 100 by absorbing and blocking the light incident from the outside. The bank 400 may include a material that absorbs at least a portion of the light, or a light reflective material, or a light scattering material.

The bank 400 may include a semi-transparent or opaque insulating material for visible light (e.g., light in the 380 nm to 750 nm wavelength range). The bank 400 may be formed of thermoplastic resin such as polycarbonate (PC), polyethylene terephthalate (PET), polyethersulfone, polyvinyl butyral, polyphenylene ether, polyamide, polyether imide, norbornene system resin, methacrylic resin, or cyclic polyolefin-based resin, thermosetting resin such as an epoxy resin, a phenol resin, a urethane resin, an acrylic resin, a vinyl ester resin, an imide-based resin, a urethane-based resin, a urea resin or a melamine resin, and organic insulating material such as polystyrene, polyacrylonitrile, or polycarbonate, but is not limited thereto.

Alternatively, the bank 400 may be formed of an inorganic insulating material such as an inorganic oxide such as SiOx, SiNx, SiNxOy, AlOx, TiOx, TaOx, or ZnOx, or inorganic nitride, but is not limited thereto.

According to an embodiment, the bank 400 may be formed of an opaque material such as black matrix. An insulating black matrix material may include resin or pastes including organic resins, glass pastes and black pigments, metal particles such as nickel, aluminum, molybdenum and alloys thereof, metal oxide particles (e.g., chromium oxide) or metal nitride particles (e.g., chromium nitride). According to another embodiment, the bank 400 may be a distributed bragg reflector (DBR) having high reflectivity or a mirror reflector formed of metal.

The LED element 300 may be disposed on the concave portion 430 of the bank 400. The LED element 300 may be a micro LED. Micro may indicate a size of 1 to 100 µm, but is not limited thereto. Therefore, the LED element 300 may employ a LED element that is greater or less than the size of 1 to 100 µm. The LED element 300 may be accommodated in the concave portion 430 of the substrate 101 by being individually or multiply picked up on the wafer by a transfer mechanism and transferred to the substrate 101. According to an embodiment, the LED element 300 may be accommodated in the concave portion 430 of the substrate 101 after the bank 400 and the first electrode 510 are formed. The LED element 300 may emit light of a predetermined wavelength within a wavelength range from ultraviolet light to visible light. For example, the LED element 300 may be a red, green, blue, white LED or UV LED.

The LED element 300 may include a p-n diode, the anode 310 and the cathode 390. The anode 310 and/or the cathode 390 may be formed of a variety of conductive materials, including metals, conductive oxides and conductive polymers. The anode 310 may be electrically connected to the signal electrode 510, and the cathode 390 may be electrically connected to the common electrode 530. The p-n diode may include a p-doped portion 330 in the anode 310 side, one or more quantum well part 350 and a n-doped portion 370 in the cathode 390 side. Alternatively, a doped portion in the cathode 390 side may correspond to the p-doped portion 330 and a doped portion in the anode 310 side may correspond to the n-doped portion 370.

A passivation layer 520 may be configured to surround the LED element 300 in the concave portion 430. The passivation layer 520 may cover the bank 400 and the LED element 300. The passivation layer 520 may include an organic insulating material. For example, the passivation layer 520 may be formed of acrylic, poly methyl methacrylate (PMMA), benzocyclobutene (BCB), polyimide, acrylate, epoxy and polyester, but is not limited thereto.

Meanwhile, the LED elements 300 contained in the display apparatus 100 may emit light in particular colors, respectively. For example, the display apparatus 100 may include a sub-pixel region SP including a LED element 300R emitting red light, a sub-pixel region SP including a LED element 300G emitting green light, and a sub-pixel region SP including a LED element 300B emitting blue light. The display apparatus 100 may group the sub-pixel region SP corresponding to the red light, the sub-pixel region SP corresponding to the green light and the sub-pixel region SP corresponding to the blue light, which are adjacent to each other, as a single pixel region P. The display apparatus 100 may select a single color represented by the corresponding pixel by combining the red light, the green light and the blue light emitted from the single pixel region P. The plurality of LED elements 300R, 300G, and 300B contained in the single pixel region P may be connected to a signal electrode 510R, 510 G, and 510B, respectively, but the plurality of LED elements 300R, 300G, and 300B may share a single common electrode 530.

When normal color light is not emitted from the pixel region P, a normal LED element may be bonded on the substrate to replace a defective LED element among the plurality of LED elements in the corresponding pixel region P. For this, an electrode pattern may be configured such that the signal electrode 510 and the common electrode 530 have an extra region (hereinafter referred to as "replaceable region").

However, because the replaceable region of the signal electrode 510 and the common electrode 530 described above should be provided to not be blocked by the black matrix, a blocking area caused by the black matrix in the pixel region P may be reduced. As a result, light may be unintentionally leaked, such as a reflection, by a metal such as the pattern on the substrate 101, and thus the contrast ratio of the display apparatus 100 may be reduced and the visibility of the black color may be reduced.

To secure a space in which the replaceable region of the signal electrode 510 and the common electrode 530 is provided, a distance between the sub pixel regions SP in the same pixel region P may be increased. Accordingly, poor mixing may occur among the red light, the green light and the blue light emitted from each sub-pixel region SP.

Therefore, in a single pixel region P, the signal electrode 510 and the common electrode 530 should be efficiently arranged in a limited space. Hereinafter a variety of cases in which the signal electrode 510 and the common electrode 530 are provided in a single pixel region P, will be described.

Figure 6:
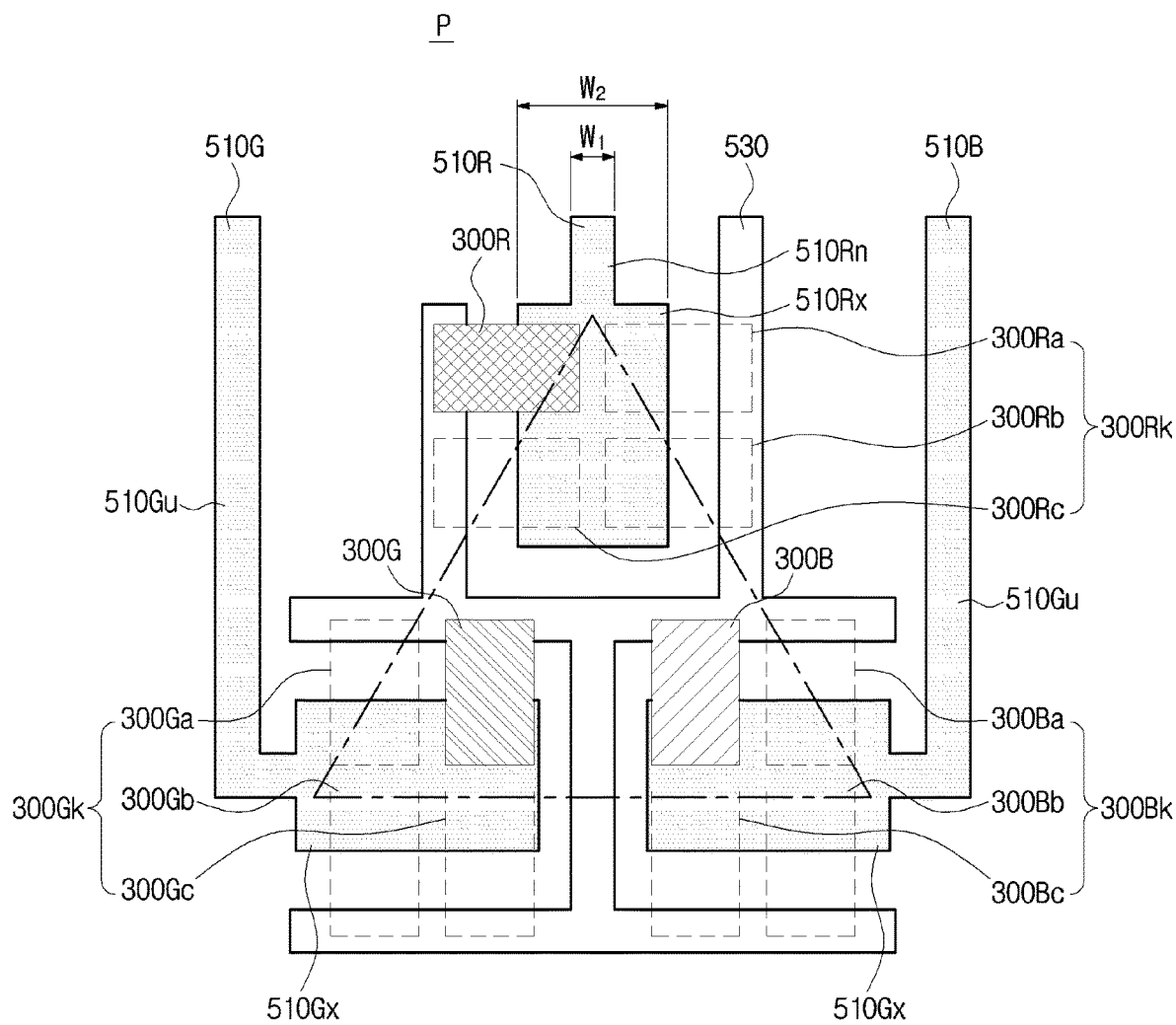
FIG. 6 is a plan view illustrating a pixel region in which a signal electrode and a common electrode are provided according to an embodiment.
Figure 7:
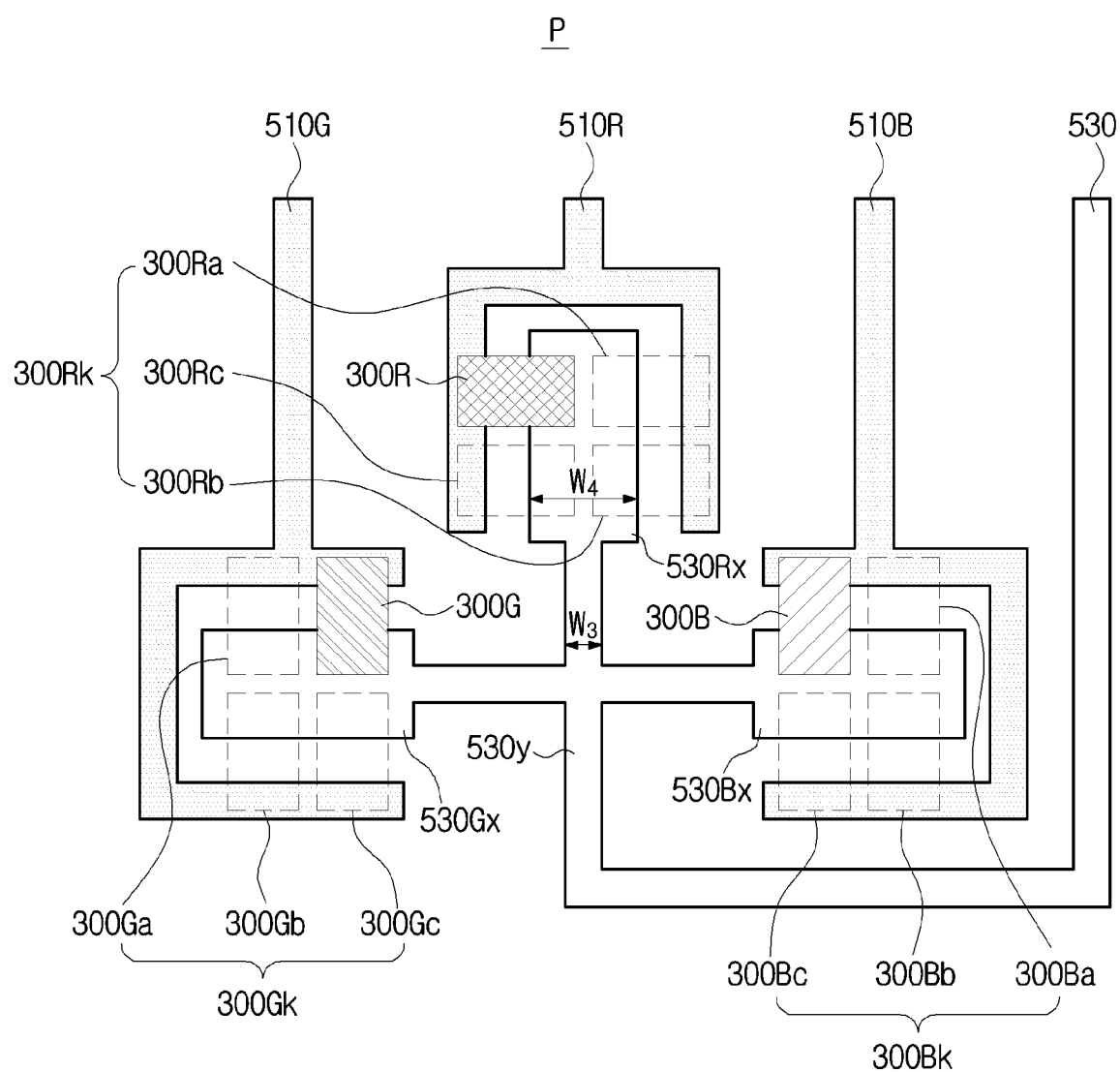
FIG. 7 is a plan view illustrating a pixel region in which a signal electrode and a common electrode are provided according to an embodiment.

FIG. 6 is a plan view illustrating a pixel region in which a signal electrode and a common electrode are provided according to an embodiment. FIG. 7 is a plan view illustrating a pixel region in which a signal electrode and a common electrode are provided according to an embodiment. In FIGS. 6 and 7, it is assumed that the sub-pixel region SP emitting red light, the sub-pixel region SP emitting green light and the sub-pixel region SP emitting blue light form a pixel region P in a triangle structure.

Referring to FIG. 6, in the single pixel region P on the display panel 110, a first signal electrode 510R connected to the anode 310 of the red LED element 300R, a second signal electrode 510G connected to the anode 310 of the green LED element 300G, a third signal electrode 510B connected to the anode 310 of the blue LED element 300B, and a single common electrode 530 connected to all of a cathode 390 of the red LED element 300R, a cathode 390 of the green LED element 300G, and a cathode 390 of the blue LED element 300B may be provided.

The common electrode 530 may be configured to surround one end of the first signal electrode 510R, one end of the second signal electrode 510G, and one end of the third signal electrode 510B. Particularly, an end portion 510Rx provided in one end of the first signal electrode 510R, an end portion 510Gx provided in one end of the second signal electrode 510G and an end portion 510Bx provided in one end of the third signal electrode 510B may be substantially surrounded or surrounded by the common electrode 530.

Referring to FIG. 6, the common electrode 530 surrounds one end of the first signal electrode 510R in U-type, the common electrode 530 surrounds one end of the second signal electrode 510G in U-type and the common electrode 530 surrounds one end of the third signal electrode 510B in U-type.

As a result, a plurality of replaceable regions 300Rk of the red LED element 300R may be provided. FIG. 6 illustrates that three replaceable regions 300Ra, 300Rb and 300Rc are provided as the replaceable region 300Rk of the red LED element.

In addition, a plurality of replaceable regions 300Gk of the green LED element 300G may be provided. FIG. 6 illustrates that three replaceable regions 300Ga, 300Gb and 300Gc are provided as the replaceable region 300Gk of the green LED element.

Further, a plurality of replaceable regions 300Bk of the blue LED element 300B may be provided. FIG. 6 illustrates that three replaceable regions 300Ba, 300Bb and 300Bc are provided as the replaceable region 300Bk of the blue LED element.

A width of one end of the first signal electrodes 510R, the second signal electrodes 510G and the third signal electrode 510B may be greater than a width of other regions. Particularly, a width of end portion 510Rx, 510Gx and 510Bx provided in the first signal electrodes 510R, the second signal electrodes 510G and the third signal electrode 510B, respectively, may be greater than a width of a connecting portion 510Ry, 510Gy and 510By respectively extended from the end portion 510Rx, 510Gx and 510Bx.

Referring to FIG. 6, a width W2 of the end portion 510Rx of the first signal electrode 510R may be greater than a width W1 of the connecting portion 510Ry of the first signal electrode 510R. In the same manner, a width of the end portion 510Gx of the second signal electrode 510G may be greater than a width of the connecting portion 510Gy of the second signal electrode 510G, and a width of the end portion 510Bx of the third signal electrode 510B may be greater than a width of the connecting portion 510By of the third signal electrode 510B. Accordingly, sufficient replaceable regions, in which the plurality of LED elements 300R, 300G, and 300B is connected to the end portion 510Rx, 501Gx, and 510Bx of the signal electrode, may be provided.

When the signal electrodes 510R, 510G, and 510B and the common electrode 530 are provided as described above, the reduction of the blocking area caused by the black matrix may be minimized. As a result, the reduction of the contrast ratio of the display apparatus may also be minimized. Further, poor mixing of the light emitted from the sub-pixel region SP may be prevented by minimizing the distance between the sub-pixel regions SP.

FIG. 6 illustrates that the common electrode 530 surrounds, or at least substantially surrounds various sides of, one end of the first signal electrode 510R, one end of the second signal electrode 510G, and one end of the third signal electrode 510B. Alternatively, the first signal electrode 510R, the second signal electrodes 510G, and the third signal electrode 510B may be configured to surround one end of the common electrode 530, respectively.

Particularly, each of three end portions 530Rx, 530Gx, and 530Bx diverged from one end of the common electrode 530 may be surrounded by the first signal electrode 510R, the second signal electrode 510G, and the third signal electrode 510B, respectively.

Referring to FIG. 7, the common electrode 530 may be provided such that one end thereof is branched into three end portions 530Rx, 530Gx, and 530Bx. The first signal electrode 510R may surround or substantially surround the first end portion 530Rx among the branched three end portions 530Rx, 530Gx, and 530Bx, the second signal electrode 510G may surround or substantially surround the second end portion 530Gx among the branched three end portions 530Rx, 530Gx, and 530Bx, and the third signal electrode 510B may surround or substantially surround the third end portion 530Bx among the branched three end portions 530Rx, 530Gx, and 530Bx.

As a result, a plurality of replaceable regions 300Rk of the red LED element 300R may be provided. FIG. 7 illustrates that three replaceable regions 300Ra, 300Rb and 300Rc are provided as the replaceable region 300Rk of the red LED element.

In addition, a plurality of replaceable regions 300Gk of the green LED element 300G may be provided. FIG. 7 illustrates that three replaceable regions 300Ga, 300Gb and 300Gc are provided as the replaceable region 300Gk of the green LED element.

Further, a plurality of replaceable regions 300Bk of the blue LED element 300B may be provided. FIG. 7 illustrates that three replaceable regions 300Ba, 300Bb and 300Bc are provided as the replaceable region 300Bk of the blue LED element.

In addition, a width W4 of end portion 530Rx, 530Gx and 530Bx of the common electrode 530 may be greater than a width W3 a connecting portion 530y extended from the three end portions 530Rx, 530Gx and 530Bx and then merged in to a single portion. Referring to FIG. 7, a width W4 of the first end portion 530Rx of the common electrode 530 may be greater than a width W3 of the connecting portion 530y. In the same manner, a width of the second end portion 530Gx of the common electrode 530 may be greater than a width of the connecting portion 530y. A width of the third end portion 530Bx of the common electrode 530 may be greater than a width of the connecting portion 530y. Accordingly, sufficient replaceable regions, in which the plurality of LED elements 300R, 300G, and 300B is connected to the plurality of end portions 530Rx, 530Gx and 530Bx of the common electrode 530, may be provided.

Similar to FIG. 6, the reduction of the contrast ratio of the display apparatus 100 may be minimized. Further, the poor mixing of the light emitted from the sub-pixel region SP may be prevented according to the example of FIG. 7.

Meanwhile, when a normal LED element is additionally connected to the signal electrode 510 and the common electrode 530 because a defective LED element is found, data signal may be leaked to the defective LED element. As a result, the normal LED may not emit light with a desired intensity.

Therefore, the signal electrode 510 and the common electrode 530 may be provided in the pixel region P to prevent the leakage current to the defective LED element. Hereinafter an embodiment, in which the signal electrode 510 and the common electrode 530 for blocking the leakage current are provided, will be described.

Figure 8:
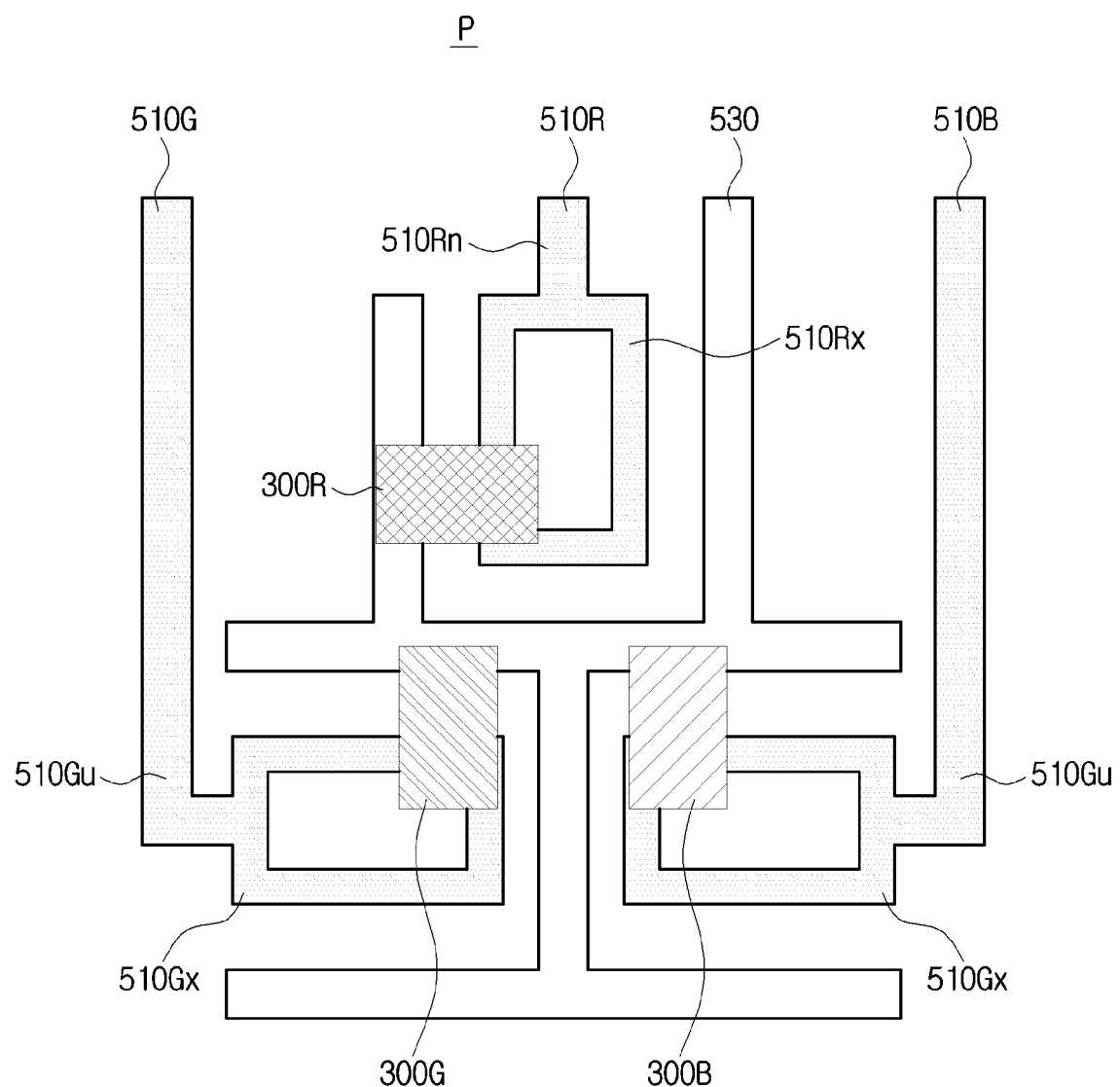
FIG. 8 is a plan view illustrating a pixel region in which a signal electrode and a common electrode are provided according to an embodiment.
Figure 9A:
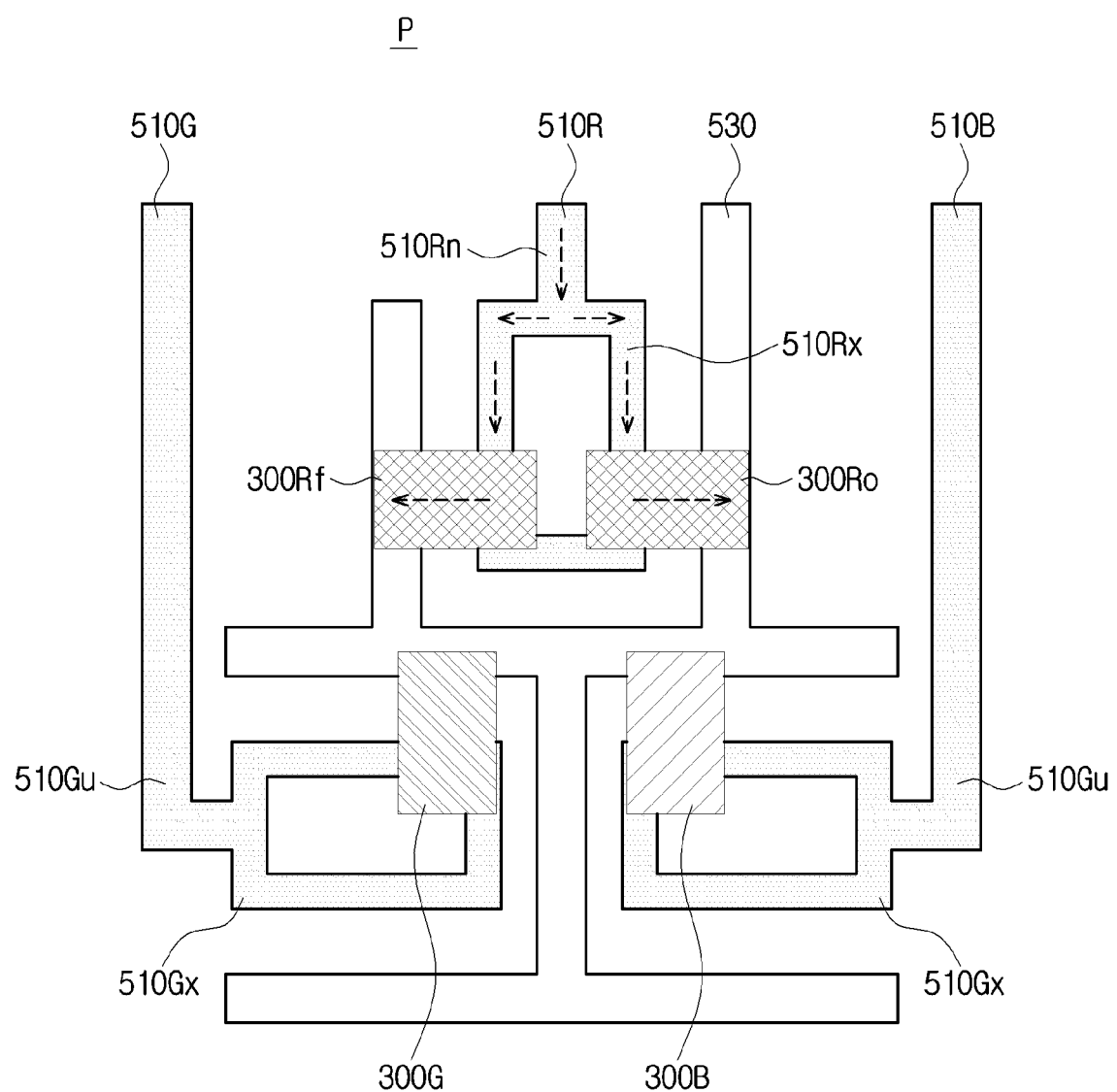
FIGS. 9A and 9B are views illustrating a method of blocking leakage current on the pixel region of FIG. 8.
Figure 9B:
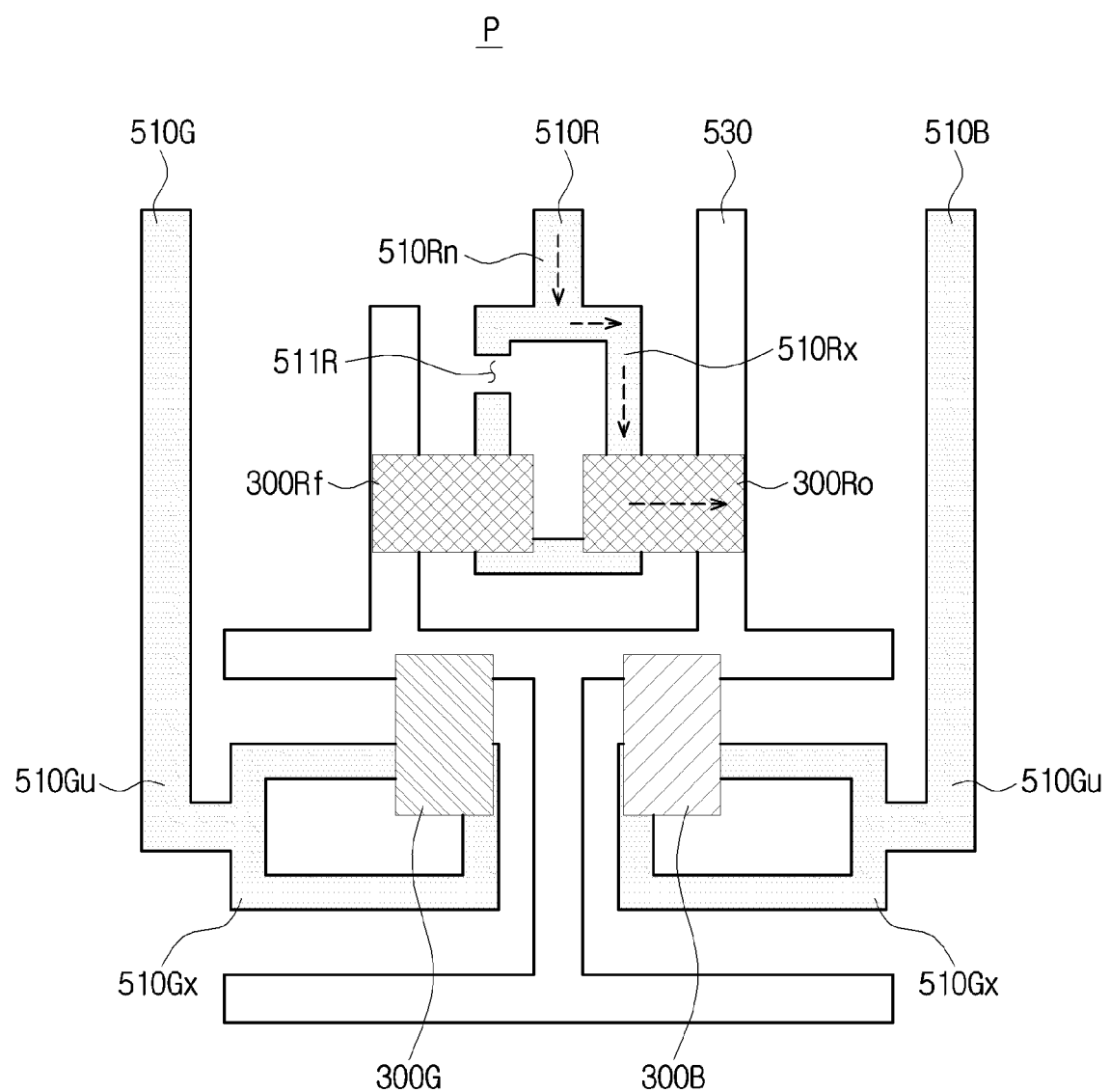

FIG. 8 is a plan view illustrating a pixel region in which a signal electrode and a common electrode are provided according to an embodiment. FIGS. 9A and 9B are views illustrating a method of blocking leakage current on the pixel region of FIG. 8.

FIG. 8 illustrates a pixel region P provided such that a single common electrode 530 surrounds or substantially surrounds each one end of a first signal electrode 510R, a second signal electrode 510G, and a third signal electrode 510B. Referring to FIGS. 8 and 9A, an anode 310 of a red LED element 300R may be connected to one end of the first signal electrode 510R, and a cathode 390 of the red LED element 300R may be connected to a common electrode 530. An anode 310 of a green LED element 300G may be connected to one end of the second signal electrode 510G, and a cathode 390 of the green LED element 300G may be connected to the common electrode 530. Further, an anode 310 of a blue LED element 300B may be connected to one end of the third signal electrode 510B, and a cathode 390 of the blue LED element 300B may be connected to the common electrode 530.

At this time, when it is identified that the LED element 300Rf emitting abnormal light is defective based on a result of test, it may be possible to newly provide a red LED element 300Ro, which is normal, on a replaceable region of the red LED element.

Referring to FIG. 9A, a normal red LED element 300Ro may be additionally provided to replace the defective red LED element 300Rf. In this case, when a data signal is applied to the first signal electrodes 510R, the data signal may flow to both the normal red LED element 300Ro connected to the first signal electrode 510R and the defective red LED element 300Rf. In FIG. 9A, an arrow indicates the traveling direction of the data signal.

As a result, all of the data signals are not supplied to the normal red LED element 300Ro, but some data signal may be leaked to the defective red LED element 300Rf. Accordingly, the normal red LED element 300Ro does not emit the originally intended red light due to the data signal leakage, and thus the intended color may not be provided.

Therefore, according to embodiments, one end of the signal electrode 510 may have an annular shape. When one end of the signal electrode 510 has an annular shape, it is possible to easily cut off a path of supplying the data signal to the defective LED element after connecting the normal LED element to the signal electrode 510. The annular shape may include an open annular shape or a closed annular shape.

Referring to FIG. 9B, an insulating portion 511R may be provided on the first signal electrode 510R. Particularly, the insulating portion 511R may be provided to cut off the path in which the data signal is leaked to the defective red LED element 300Rf after connecting the normal red LED element 300Ro to the first signal electrode 510R having an annular end portion 510Rx.

The insulating portion 511R may be provided by disconnecting a leakage path of the first signal electrode 510R or by adding a material blocking the flow of the current, to the leakage path of the first signal electrode 510R.

Accordingly, the data signal may be normally supplied to the normal red LED element 300Rf without leakage of the data signal to the defective red LED element 300Rf.

Hereinbefore it is assumed that the plurality of sub pixel regions SP forming a single pixel region P has a triangular structure. However, the plurality of sub pixel regions SP forming a single pixel region P may be arranged in one direction.

Hereinafter an arrangement of a signal electrode 510 and a common electrode 530 of a pixel region P including a plurality of sub-pixel regions SP arranged in one direction will be described with reference to FIGS. 10A and 10B.

Figure 10A:
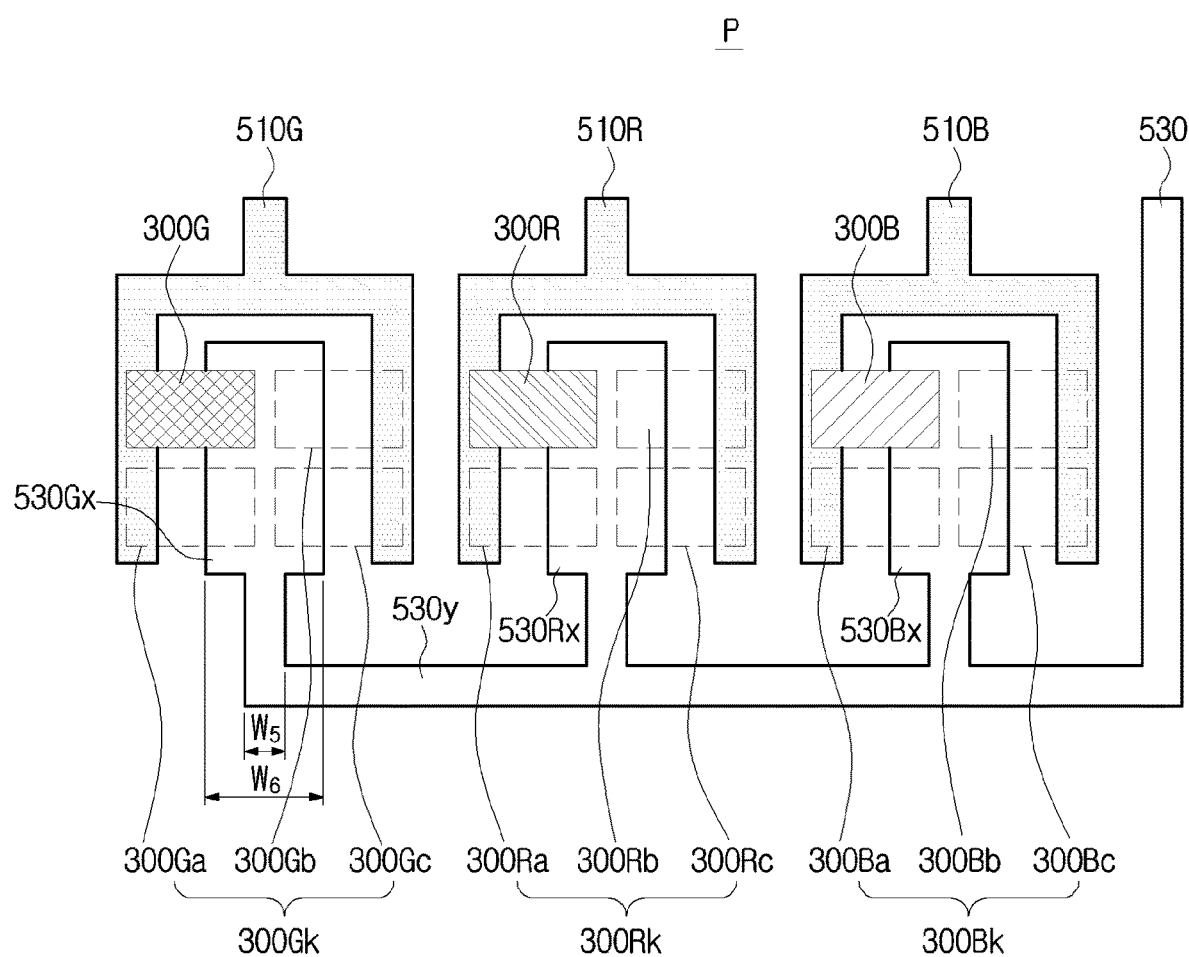
FIGS. 10A and 10B are plan views illustrating a pixel region in which a signal electrode and a common electrode are provided according to embodiments.
Figure 10B:
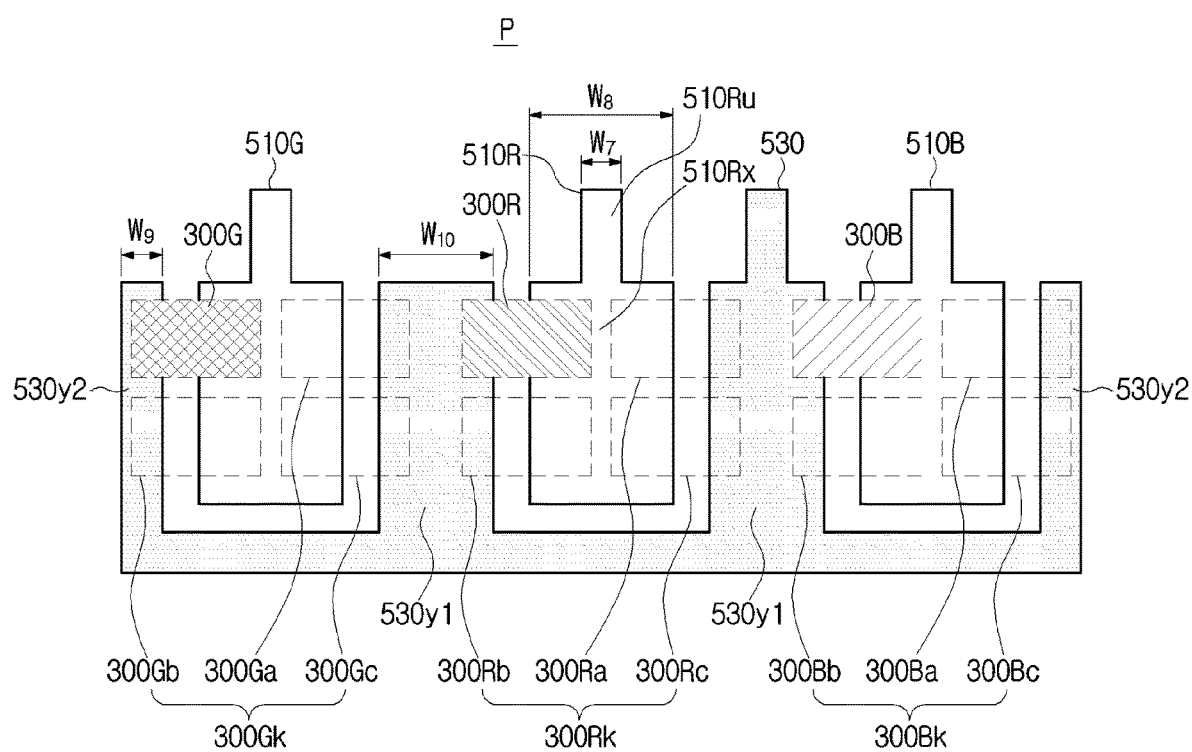

FIGS. 10A and 10B are plan views illustrating a pixel region in which a signal electrode and a common electrode are provided according to embodiments.

FIG. 10A illustrates a pixel region P in which a sub-pixel region SP emitting green light, a sub-pixel region SP emitting red light, and a sub-pixel region SP emitting blue light are sequentially arranged from the left side to the right side.

When the plurality of sub-pixel regions SP is arranged in one direction, a first signal electrode 510R, a second signal electrode 510G, a third signal electrode 510B may surround or substantially surround a plurality of end portions 530Rx, 530Gx and 530Bx of a common electrode 530, respectively, in the same manner as the plurality of sub-pixel regions SP having the triangular structure.

As a result, a plurality of replaceable regions 300Rk of the red LED element 300R may be provided. FIG. 10A illustrates that three replaceable regions 300Ra, 300Rb and 300Rc are provided as the replaceable region 300Rk of the red LED element.

In addition, a plurality of replaceable regions 300Gk of the green LED element 300G may be provided. FIG. 10A illustrates that three replaceable regions 300Ga, 300Gb and 300Gc are provided as the replaceable region 300Gk of the green LED element.

Further, a plurality of replaceable regions 300Bk of the blue LED element 300B may be provided. FIG. 10A illustrates that three replaceable regions 300Ba, 300Bb and 300Bc are provided as the replaceable region 300Bk of the blue LED element.

In addition, a width W6 of end portion 530Rx, 530Gx and 530Bx of the common electrode 530 may be greater than a width W5 of a connecting portion 530y extended from the three end portions 530Rx, 530Gx and 530Bx, respectively, and then merged in to a single portion. Referring to FIG. 10A, a width W6 of the second end portion 530Gx of the common electrode 530 may be greater than a width W5 of the connecting portion 530y. In the same manner, a width of the first end portion 530Rx of the common electrode 530 may be greater than a width of the connecting portion 530y. A width of the third end portion 530Bx of the common electrode 530 may be greater than a width of the connecting portion 530y. Accordingly, sufficient replaceable regions, in which the plurality of LED elements 300R, 300G, and 300B is connected to the plurality of end portions 530Rx, 530Gx and 530Bx of the common electrode 530, may be provided.

Accordingly, the reduction of the contrast ratio of the display apparatus 100 may be minimized. Further, the poor mixing of the light emitted from the sub-pixel region SP may be prevented according to the example of FIG. 10A.

FIG. 10A illustrates that the first signal electrode 510R, the second signal electrodes 510G, and the third signal electrode 510B may be configured to surround or substantially surround the common electrode 530, respectively. Alternatively, the common electrode 530 may surround or substantially surround one end of the first signal electrode 510R, one end of the second signal electrode 510G, and one end of the third signal electrode 510B.

Referring to FIG. 10B, in a single pixel region, a sub-pixel region SP emitting green light, a sub-pixel region SP emitting red light and a sub-pixel region SP emitting blue light may arranged in one direction.

The common electrode 530 may be configured to surround or substantially surround an end portion 510Rx of the first signal electrode 510R, an end portion 510Gx of the second signal electrode 510G and an end portion 510Bx of the third signal electrode 510B. Referring to FIG. 10B, the common electrode 530 surrounds various sides of one end of the first signal electrode 510R in U-type, the common electrode 530 surrounds various sides of one end of the second signal electrode 510G in U-type and the common electrode 530 surrounds various sides of one end of the third signal electrode 510B in U-type.

As a result, a plurality of replaceable regions 300Rk of the red LED element 300R may be provided. FIG. 10B illustrates that three replaceable regions 300Ra, 300Rb and 300Rc are provided as the replaceable region 300Rk of the red LED element.

In addition, a plurality of replaceable regions 300Gk of the green LED element 300G may be provided. FIG. 10B illustrates that three replaceable regions 300Ga, 300Gb and 300Gc are provided as the replaceable region 300Gk of the green LED element.

Further, a plurality of replaceable regions 300Bk of the blue LED element 300B may be provided. FIG. 10B illustrates that three replaceable regions 300Ba, 300Bb and 300Bc are provided as the replaceable region 300Bk of the blue LED element.

A width W8 of one end of the first signal electrodes 510R, the second signal electrodes 510G and the third signal electrode 510B may be greater than a width W7 of other regions. Particularly, a width W8 of end portion 510Rx, 510Gx and 510Bx provided in the first signal electrodes 510R, the second signal electrodes 510G and the third signal electrode 510B may be greater than a width W7 of a connecting portion 510Ry, 510Gy and 510By extended from the end portion 510Rx, 510Gx and 510Bx.

Referring to FIG. 10B, a width W8 of the end portion 510Gx of the second signal electrode 510G may be greater than a width W7 of the connecting portion 510Gy of the second signal electrode 510G. In the same manner, a width of the end portion 510Rx of the first signal electrode 510R may be greater than a width of the connecting portion 510Ry of the second signal electrode 510R, and a width of the end portion 510Bx of the third signal electrode 510B may be greater than a width of the connecting portion 510By of the third signal electrode 510B. Accordingly, sufficient replaceable regions, in which the plurality of LED elements 300R, 300G, and 300B is connected to the end portion 510Rx, 501Gx, and 510Bx of the signal electrode, may be provided.

In addition, in the common electrode 530 surrounding the end portions 510Rx, 510Gx and 510Bx of the signal electrodes 510R, 510G and 510B, a width of a first region 530y1 of the common electrode 530 may be greater than a width of a second region 530y2 of the common electrode 530, in which the first region 530y1 is disposed among the end portions 510Rx, 510Gx and 510Bx of the plurality of signal electrodes 510R, 510G and 510B in the same pixel region P and the second region 530y2 is disposed on opposite sides of the same pixel region P.

Referring to FIG. 10B, a width W10 of the first region 530y1 may be greater than a width W9 of the second region 530y2. The first region 530y1 may include a region between the end portion 510Rx of the first signal electrode 510R and the end portion 510Gx of the second signal electrode 510G, and a region between the end portion 510Rx of the first signal electrode 510R and the end portion 510Bx of the third signal electrode 510B. The second region 530y2 may be disposed opposite sides of the pixel region P, and the second region 530y2 may include a region adjacent to one side of the end portion 510Gx of the second signal electrode 510G and a region adjacent to one side of the end portion 510Bx of the third signal electrode 510B. Accordingly, sufficient replaceable regions, in which the plurality of LED elements 300R, 300G, and 300B is connected to the first region 530y1 of the common electrode 530, may be provided.

When the signal electrodes 510R, 510G, and 510B and the common electrode 530 are provided as described above, the reduction of the blocking area caused by the black matrix may be minimized. As a result, the reduction of the contrast ratio of the display apparatus may also be minimized. Further, the poor mixing of the light emitted from the sub-pixel region SP by minimizing the distance between the sub-pixel regions SP may be prevented.

Accordingly, the reduction of the contrast ratio of the display apparatus 100 may be minimized. Further, the poor mixing of the light emitted from the sub-pixel region SP may be prevented according to the example of FIG. 10B.

Figure 11:
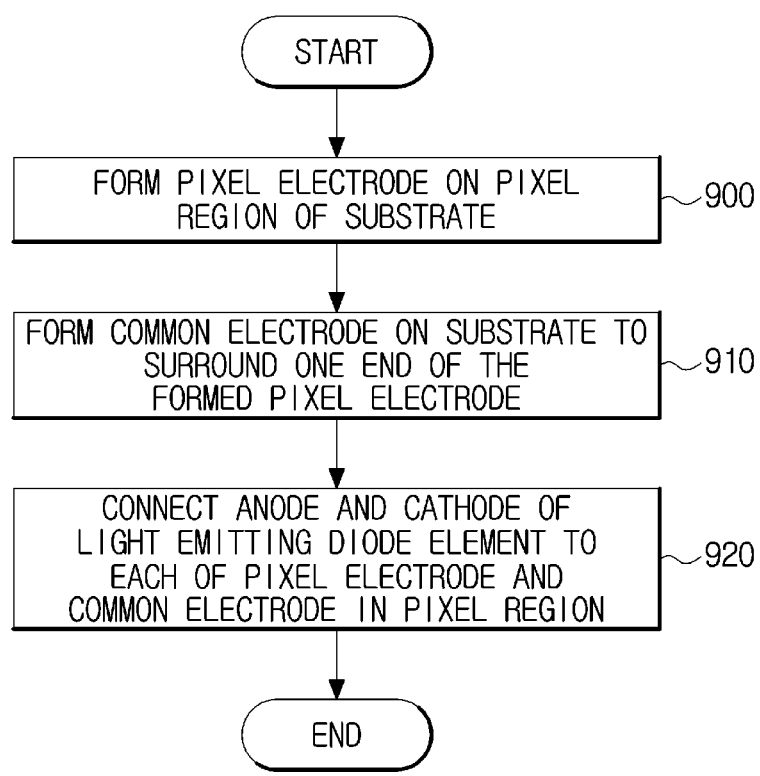
FIG. 11 is a flowchart illustrating a method of manufacturing a display apparatus according to an embodiment.

FIG. 11 is a flowchart illustrating a manufacturing method of a display apparatus according to an embodiment.

The signal electrode 510 may be formed on the pixel region P on the substrate 101 (900). Pixel region P may represent a region composed of the plurality of sub-pixel regions SP corresponding to red, green and blue adjacent to each other, among the sub-pixel region SP formed on an intersection between the data line 111a transmitting the data signal and the scan line 111b transmitting the scan signal. The signal electrode 510 may represent an electrode forming a path for transmitting the data signal to the LED element 300 by being connected to the drain electrode 230b of the driver transistor M1.

The common electrode 530 may be formed to surround one end of the signal electrode 510 (910). The common electrode 530 may represent an electrode connected to the reference voltage VSS, which is lower than the power voltage VDD of the LED element 300, and the common electrode 530 may provide a ground to the LED element 300.

The anode 310 and the cathode 390 of the LED element 300 may be connected to the signal electrode 510 and the common electrode 530 on the pixel region P (920). When it is identified that the LED element 300 is defective, it may be possible to restore the pixel region P by additionally connecting a normal LED element 300 to a replaceable region.

FIG. 10B illustrates that the common electrode 530 surrounds one end of the signal electrode 510, but alternatively, the signal electrode 510 may surround one end of the common electrode 530, as in FIG. 10A.

Because the common electrode 530 and the signal electrode 510 are provided such that one of the common electrode 530 and the signal electrode 510 surrounds or substantially surrounds the other of the common electrode 530 and the signal electrode 510, sufficient replaceable region adjacent to the signal electrode 510 and the common electrode 530 may be provided, in which the replaceable region represents a region to which an additional LED element 300 is connected.

As is apparent from the above description, according to the proposed display apparatus and manufacturing method thereof, it may be possible to secure the replaceable region, to which the normal LED element is connected to replace the defective LED element, in the minimal pixel region, because between the signal electrode and the common electrode, one electrode surrounds the other electrode or because one of the signal electrode and the common electrode has an annular shape. Therefore, it may be possible to minimize the reduction of the blocking area caused by the black matrix and thus it may be possible to minimize the reduction of the contrast ratio of the display apparatus.

Further, it may be possible to prevent the poor mixing of the light emitted from the sub-pixel region by minimizing the distance between the sub-pixel regions.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A display apparatus comprising:
   a plurality of pixel regions,
   wherein each of the plurality of pixel regions comprises:
      a plurality of light emitting diode (LED) elements;
      a plurality of signal electrodes configured to supply data signals to the plurality of LED elements, respectively; and
      a common electrode that is shared by the plurality of LED elements and configured to provide a ground to the plurality of LED elements,
   wherein, in a plan view:
      the common electrode is interposed between each of the plurality of signal electrodes to respectively surround three sides of distal ends of each of the plurality of signal electrodes while fourth sides of each of the distal ends of each of the plurality of signal electrodes are exposed from the common electrode, in respective facing directions of the fourth sides, between a respective two ends of the common electrode, wherein the respective facing directions are different directions that extend away from each other, and the plurality of LED elements are each connected to the common electrode and one of the distal ends of the plurality of signal electrodes, or
      the plurality of signal electrodes is arranged to respectively surround three sides of distal ends of the common electrode while fourth sides of each of the distal ends of the common electrode are exposed from the plurality of signal electrodes, in respective facing directions of the fourth sides, between two ends of a respective one of the plurality of signal electrodes, wherein the respective facing directions are different directions that extend toward each other, and the plurality of LED elements are each connected to one of the distal ends of the common electrode and one of the plurality of signal electrodes.

2. The display apparatus of claim 1, wherein when the common electrode is interposed between each of the plurality of signal electrodes to respectively surround the three sides of the distal ends of each of the plurality of signal electrodes, a width of the distal ends of each of the plurality of signal electrodes surrounded by the common electrode is greater than a width of the common electrode, and
   when the plurality of signal electrodes is arranged to respectively surround the three sides of the distal ends of the common electrode, a width of the distal ends of the common electrode surrounded by the plurality of signal electrodes is greater than a width of the plurality of signal electrodes.

3. The display apparatus of claim 1, further comprising:
   a substrate having a plurality of scan lines and a plurality of data lines provided on one side thereof,
   wherein the each of the plurality of pixel regions comprises a plurality of sub-pixel regions formed on intersections between the plurality of scan lines and the plurality of data lines.

4. The display apparatus of claim 3, wherein the plurality of LED elements is bonded on the plurality of signal electrodes, respectively, and the common electrode.

5. The display apparatus of claim 3, wherein the each of the plurality of pixel regions is composed of three sub-pixel regions adjacent to each other.

6. The display apparatus of claim 3, wherein a replaceable region of each of the plurality of LED elements is provided in the plurality of sub-pixel regions.

7. The display apparatus of claim 1, wherein each of the plurality of signal electrodes comprises an end portion connected to an LED element among the plurality of LED elements provided on one end of the signal electrode and a connecting portion extended from the end portion.

8. The display apparatus of claim 7, wherein the end portion is provided in an annular shape.

9. The display apparatus of claim 1, wherein the plurality of signal electrodes is arranged to respectively surround the three sides of the distal ends of the common electrode, and
   the common electrode comprises a plurality of connecting portions extended from the distal ends of the common electrode.

10. The display apparatus of claim 9, wherein the distal ends of the common electrode are provided in an annular shape.

11. The display apparatus of claim 9, wherein a width of each of the distal ends of the common electrode is greater than a width of the plurality of connecting portions.

12. The display apparatus of claim 1, wherein when the common electrode is interposed between each of the plurality of signal electrodes to respectively surround the three sides of the distal ends of each of the plurality of signal electrodes, the distal ends of each of the plurality of signal electrodes are provided in an annular shape, and
   when the plurality of signal electrodes is arranged to respectively surround the three sides of the distal ends of the common electrode, the distal ends of the common electrode are provided in the annular shape.

13. The display apparatus of claim 12, wherein the annular shape comprises an open annular shape or a closed annular shape.

14. The display apparatus of claim 12, wherein when the common electrode is interposed between each of the plurality of signal electrodes to respectively surround the three sides of the distal ends of each of the plurality of signal electrodes, a width of the distal ends of each of the plurality of signal electrodes surrounded by the common electrode is greater than a width of the common electrode, and
   when the plurality of signal electrodes is arranged to respectively surround the three sides of the distal ends of the common electrode, a width of the distal ends of the common electrode surrounded by the plurality of signal electrodes is greater than a width of the plurality of signal electrodes.

15. The display apparatus of claim 12, further comprising:
   a substrate having a plurality of scan lines and a plurality of data lines provided on one side thereof,
   wherein the each of the plurality of pixel regions comprises a plurality of sub-pixel regions formed on intersections between the plurality of scan lines and the plurality of data lines.

16. The display apparatus of claim 15, wherein the each of the plurality of pixel regions is composed of three sub-pixel regions adjacent to each other.

17. A method of manufacturing a display apparatus, the method comprising:
   providing a plurality of signal electrodes configured to supply data signals to a plurality of light emitting diode (LED) elements on a substrate;
   providing a common electrode configured to provide a ground to the plurality of light emitting diode (LED) elements on the substrate; and
   providing the plurality of light emitting diode (LED) elements on the substrate,
   wherein the plurality of LED elements, the plurality of signal electrodes, and the common electrode are contained in each of a plurality of pixel regions comprised in the display apparatus, and
   wherein, in a plan view:
   the common electrode is interposed between each of the plurality of signal electrodes to respectively surround three sides of distal ends of each of the plurality of signal electrodes while fourth sides of each of the distal ends of each of the plurality of signal electrodes are exposed from the common electrode, in respective facing directions of the fourth sides, between a respective two ends of the common electrode, wherein the respective facing directions are different directions that extend away from each other, and the plurality of LED elements are each connected to the common electrode and one of the distal ends of the plurality of signal electrodes, or
   the plurality of signal electrodes is arranged to respectively surround three sides of distal ends of the common electrode while fourth sides of each of the distal ends of the common electrode are exposed from the plurality of signal electrodes, in respective facing directions of the fourth sides, between two ends of a respective one of the plurality of signal electrodes, wherein the respective facing directions are different directions that extend toward each other, and the plurality of LED elements are each connected to one of the distal ends of the common electrode and one of the plurality of signal electrodes.

* * * * *